US012791625B2

(12) United States Patent
Ati et al.

(10) Patent No.: US 12,791,625 B2
(45) Date of Patent: Nov. 10, 2026

(54) METHOD FOR ESTIMATING THE STATE OF HEALTH OF AN ELECTRIC OR HYBRID VEHICLE BATTERY

(71) Applicant: AMPERE S.A.S., Boulogne Billancourt (FR)

(72) Inventors: Mohamed Ati, Guyancourt Cedex (FR); Samuel Cregut, Guyancourt Cedex (FR); Isabel Jimenez-Gordon, Guyancourt Cedex (FR); Jana Kalawoun, Guyancourt Cedex (FR); Julien Malrieu, Guyancourt Cedex (FR); Masato Origuchi, Guyancourt Cedex (FR)

(73) Assignee: AMPERE S.A.S., Boulogne Billancourt (FR)

( * ) Notice: Subject to any disclaimer, the term of this patent is extended or adjusted under 35 U.S.C. 154(b) by 187 days.

(21) Appl. No.: 18/837,466

(22) PCT Filed: Feb. 3, 2023

(86) PCT No.: PCT/EP2023/052624
§ 371 (c)(1),
(2) Date: Aug. 9, 2024

(87) PCT Pub. No.: WO2023/156216
PCT Pub. Date: Aug. 24, 2023

(65) Prior Publication Data

US 2025/0147115 A1 May 8, 2025

(30) Foreign Application Priority Data

Feb. 17, 2022 (FR) ....................................... 2201397

(51) Int. Cl.
*G01R 31/392* (2019.01)
*B60L 58/13* (2019.01)
(Continued)

(52) U.S. Cl.
CPC ............ *G01R 31/392* (2019.01); *B60L 58/13* (2019.02); *B60L 58/16* (2019.02); *G01R 31/3835* (2019.01)

(58) Field of Classification Search
None
See application file for complete search history.

(56) References Cited

U.S. PATENT DOCUMENTS

2013/0066573 A1 3/2013 Bon et al.
2015/0070024 A1* 3/2015 Kim ..................... G01R 31/392 324/430

(Continued)

FOREIGN PATENT DOCUMENTS

DE 10 2019 209 685 A1 1/2021

OTHER PUBLICATIONS

International Search Report mailed on Feb. 17, 2023 in PCT/EP2023/052624 filed on Feb. 3, 2023 (2 pages).

(Continued)

*Primary Examiner* — Jas A Sanghera
(74) *Attorney, Agent, or Firm* — Oblon, McClelland, Maier & Neustadt, L.L.P.

(57) ABSTRACT

A method for estimating the state of health of an electric or hybrid vehicle battery that can be carried out while the vehicle is running includes: (a) a full charge step; (b) a first relaxation step; (c) a step of discharging to a state of charge SOC≤SOCtarget carried out in k vehicle driving cycles, for each of which the capacity Qn discharged by the battery is determined; (d) a second relaxation step at the end of the cycle k; (e) a step of determining a state of charge SOCOCV as a function of the open circuit voltage; (f) a step of determining an initial discharge capacity Qi of the new battery from SOCOCV; and (g) a step of estimating the state (Continued)

of health SOH of the battery from the total capacity discharged by the battery during step (c) and from Qi.

10 Claims, 1 Drawing Sheet

(51) Int. Cl.
*B60L 58/16* (2019.01)
*G01R 31/3835* (2019.01)

(56) References Cited

U.S. PATENT DOCUMENTS

2019/0170826 A1 6/2019 Shoa Hassani Lashidani
2019/0170827 A1 6/2019 Shoa Hassani Lashidani

OTHER PUBLICATIONS

Preliminary French Search Report dated Oct. 25, 2022 in French Application 2201397 filed on Feb. 17, 2022 (3 pages, with Translation of Categories).

* cited by examiner

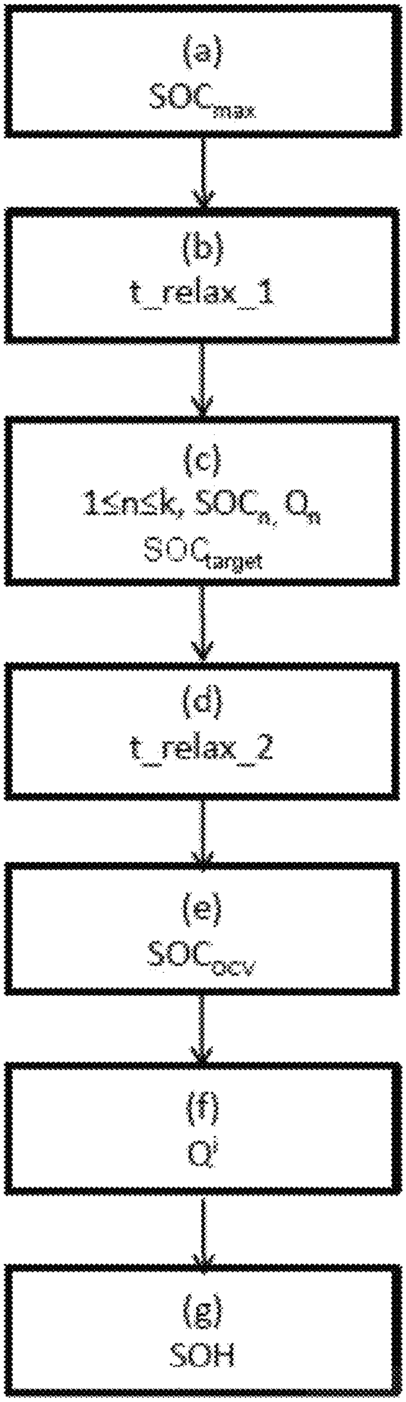
(a)
SOCmax
(b)
t_relax_1
(c)
1≤n≤k, SOCn, Qn
SOCtarget
(d)
t_relax_2
(e)
SOCocv
(f)
Qi
(g)
SOH

METHOD FOR ESTIMATING THE STATE OF HEALTH OF AN ELECTRIC OR HYBRID VEHICLE BATTERY

FIELD OF THE INVENTION

The present invention relates to a method for estimating the state of health of a battery. It notably relates to batteries intended to power electric or hybrid motor vehicles.

PRIOR ART

Determining the state of health, or the aging, of a battery is an essential criterion for characterizing the state of a battery, in order to optimize energy discharging/charging, as well as the lifetime of the accumulators of the battery.

The state of health, or SOH, of a battery can be defined by the ratio of the capacity of the battery to store energy at an instant t to the nominal capacity of the battery to store energy (i.e., the capacity of the new battery, before any use thereof). It is therefore an indicator of the state of health of a battery taking into account the level of degradation of the autonomy of the battery, notably due to the age of the battery and the conditions of use thereof.

Knowing the state of health of a battery, and especially vehicle traction batteries, is crucial for technical, economic and legal reasons. Indeed, the state of health of a battery must be precisely known in order to avoid the risk of an untimely failure, or an unexpected degradation of the performance capabilities of the system powered by said battery. In particular, the electronic system for managing and controlling the various parameters of a battery, called BMS ("Battery Management System"), takes into account, for example, an estimated SOH in order to compute the maximum available power, or even in order to estimate the state of charge, or SOC, of the battery. Moreover, the economic value of the battery is linked to its SOH, which allows the remaining lifetime of the battery to be estimated. The economic value of an electric or hybrid vehicle is consequently also linked to the SOH of its traction battery. Finally, the regulations for electric and hybrid vehicles are changing and there are plans to stipulate that the state of health of a traction battery estimated by the BMS is determined with precision of the order of 5%.

Currently, the state of charge of a traction battery is estimated by the BMS based on physical or empirical models. Some models use electrochemical properties and/or performance capabilities that can be measured when the battery is used. This is then referred to as an "online" estimation of the SOH. Thus, for example, document CN 113296010 describes a method for online evaluation of the state of health of a battery based on the analysis of the differential voltage that involves establishing a curve representing the voltage variation as a function of the variation of the capacity under given discharging conditions. The described method then establishes a model in which the slope of a tangent to this curve is correlated with the SOH. This model is used to estimate the SOH of a battery discharged under the same conditions as those used to establish the curve.

The precision of the estimation of the SOH nevertheless can vary depending on the type of model and the quality of its calibrations. For example, empirical models of the degradation of a battery can allow the SOH to be estimated with good precision up to a given SOH, for example, an SOH of 70%. Beyond this, the error in the estimation is likely to increase since the degradation is more difficult to model.

The SOH of a battery also can be precisely determined by directly measuring the available capacity of the battery. However, this type of measurement requires removing the battery from the vehicle, which can prove to be difficult and expensive.

Therefore, a need still exists for reliably and precisely estimating the SOH of a battery, notably online, and especially when the vehicle is running, yet without disrupting the operation of the vehicle.

SUMMARY OF THE INVENTION

To this end, the present invention proposes a method for estimating the state of health of a battery of an electric or hybrid vehicle, comprising:

(a) a step of charging the battery until the battery reaches a maximum state of charge $SOC_{max}$;

(b) a first relaxation step, during which the battery is not used for a first duration;

(c) a step of discharging the battery until the battery reaches a state of charge that is less than or equal to a non-zero target state of charge $SOC_{target}$, with this discharging step being carried out in a number k of running cycles of the vehicle, with k being a non-zero integer, and, for each running cycle n where $1 \leq n \leq k$, the capacity $Q_n$ discharged by the battery is determined;

(d) a second relaxation step, at the end of the running cycle k, during which step the battery is not used for a second duration;

(e) a step of determining a state of charge $SOC_{OCV}$ of the battery as a function of the open-circuit voltage, with the battery not being used;

(f) a step of determining an initial discharge capacity $Q^i$ of the battery in a new state based on the state of charge determined in step (e) and on a previously established correlation for the battery in a new state and correlating the initial discharge capacity with the state of charge of the battery; and (g) a step of estimating the state of health SOH of the battery based on the total capacity discharged by the battery during the discharging step (c) and on the initial discharge capacity determined in step (f).

The method according to the invention allows precise estimation of the state of health of the vehicle without having to remove the battery from the vehicle and without the driver having to modify how their vehicle runs.

The method according to the invention can further comprise one or more of the following features:

during the estimating step (g), the state of health SOH of the battery can be estimated using the following equation:

[Math 1]

$$SOH = \frac{\sum_{n=1}^{k} Q_n}{Q^i} \times 100 \quad \text{(Eq 1)}$$

where $Q_n$ represents the capacity discharged by the battery during a running cycle n, with n being a non-zero integer ranging from 1 to k, and $Q^i$ represents the initial discharge capacity;

between the first relaxation step (b) and the discharging step (c), a checking step can be provided involving checking that the state of charge of the battery in the relaxed state has reached the maximum state of charge;

during the discharging step (c), for each running cycle, the capacity discharged by the battery can take into account a charging capacity received by the battery;

during the discharging step (c), the capacity discharged by the battery (i) can be determined by Coulomb counting the ampere-hours drawn from the battery, or (ii) by Coulomb counting the ampere-hours drawn from and supplied to the battery and by subtracting the ampere-hours supplied to the battery from the ampere-hours drawn from the battery;

for each running cycle n of the discharging step (c), a value of the state of charge $SOC_n$ of the battery (i) can be estimated by measuring the voltage of the battery when running or (ii) by Coulomb counting, then the value of the state of charge $SOC_n$ is compared with the target state of charge value $SOC_{target}$ and step (c) is considered to be complete when $SOC_n$ is less than or equal to $SOC_{target}$;

the correlation used during step (f) has been set for a defined temperature range, during each running cycle of the discharging step (c), (i) the battery can be maintained at a temperature within this defined temperature range, or (ii) a corrective factor can be applied to the capacity $Q_n$ discharged by the battery as a function of the temperature of the battery.

A further aim of the invention is a computer program comprising the instructions for executing the steps of the estimation method according to the invention, when said instructions are executed by one or more processors.

A further aim of the invention is a computer-readable medium that stores the computer program of the invention.

The term “computer-readable medium” is understood to mean any memory, any storage device, any storage mechanism and any other storage and signaling mechanism, including the interfaces and the devices such as the network interface cards and the buffer memories therein, as well as any communication device and any received and transmitted signal, and any other current and scalable technology that a computerized system can interpret, receive and/or transmit. This concept includes not only a computer-readable medium, such as a hard disk connected to a central unit and with which the stored program is directly executed, but also a computer-readable medium such as a CD-ROM that stores a program to be executed after it has been installed on a hard disk. A program in this case not only includes a program that can be directly executed, but also a program in the source format, a compressed program and an encrypted program.

The estimation method according to the invention notably can be implemented by means of the management system of the invention described hereafter.

Thus, the aim of the invention is also a system for managing a battery configured to estimate the state of charge of a battery by implementing the steps of the estimation method according to the invention.

Finally, an aim of the invention is a motor vehicle equipped with a traction battery comprising a battery management system according to the invention.

DESCRIPTION OF THE FIGURES

The sole FIGURE shows a flowchart of the estimation method according to one embodiment of the invention.

DETAILED DESCRIPTION OF THE INVENTION

The present invention is based on estimating the state of health SOH of a battery based on a capacity.

The first step (a) is a step of fully charging the battery, in other words, until the battery reaches a maximum state of charge, denoted $SOC_{max}$.

Thus, during this charging step (a), the state of charge of the battery can be monitored. It is thus possible (i) to charge the battery, (ii) to monitor the state of charge of the battery during this charging step and (iii) to continue charging as long as this state of charge has not reached a maximum state of charge. During this monitoring, it is possible to determine the value of the state of charge, for example, based on a measurement of the voltage of the battery, and to compare it with the value of a maximum state of charge.

It is possible to proceed as follows, for example:

(i) the battery is placed on charge;

(ii) the value of the voltage at the terminals of the battery is measured;

(iii) the value of the measured voltage is compared with a threshold voltage value corresponding to a maximum state of charge of the battery;

(iv) if the value of the measured voltage reaches said threshold voltage value, charging of the battery is stopped, the battery is considered to be in a maximum state of charge and the charging is stopped, otherwise charging of the battery is continued. The reiteration frequency can be determined by a person skilled in the art as a function of the type of battery. The value of the voltage measured at the terminals of the battery in this case corresponds to the open-circuit voltage, with the vehicle stationary. The threshold voltage value and the corresponding maximum state of charge can be determined by a person skilled in the art as a function of the type of battery based on curves of the state of charge as a function of the open-circuit voltage. These threshold voltage and maximum state of charge values can be stored in a management system, for example, in the form of maps or curves.

This charging step (a) is followed by a first relaxation step (b), during which the battery is not used for a first duration t_relax_1. This pause time notably ensures the temperature stabilization of the battery on completion of charging and thus improves the precision of estimating its state of charge. This first duration of the relaxation step can be determined beforehand by a person skilled in the art. It is, for example, from 15 minutes to 6 hours, typically from 30 minutes to 1 hour.

In order to improve the precision of determining the state of charge, the method according to the invention can comprise, after the first relaxation step (b) and before the discharging step (c), a checking step involving checking that the state of charge of the battery in the relaxed state has reached the maximum state of charge $SOC_{max}$. If this is the case, the method proceeds to step (c), otherwise, the method can be interrupted, or steps (a) and (b) can be repeated until the checking step confirms that the battery in the relaxed state has reached the maximum state of charge.

During this checking step, it is possible, for example, to:

(i) determine the value of a state of charge of the battery in the relaxed state $SOC_{relax}$, for example, by measuring the open voltage at the terminals of the battery;

(ii) compare the value of the state of charge of the battery in the relaxed state $SOC_{relax}$ with the value of the maximum state of charge $SOC_{max}$;

(iii) determine that charging is complete and proceed to step (c) if the value of $SOC_{relax}$ is equal to the value $SOC_{max}$, otherwise, repeat steps (a) and (b).

It is also possible to proceed as follows:

(i) measure the value of the voltage at the terminals of the battery in the relaxed state;

(ii) compare the value of the measured voltage with a threshold voltage value corresponding to a maximum state of charge of the battery;

(iii) determine that charging is complete and proceed to step (c) if the value of the measured voltage is equal to the threshold voltage value, otherwise, repeat steps (a) and (b).

Subsequently, during the discharging step (c), the driver uses the vehicle as normal. This discharging step lasts as long as the battery has not reached a state of charge that is equal to or less than a target state of charge $SOC_{target}$, which can occur in one or more running cycles. It should be noted that when this discharging step (c) is carried out over several running cycles, the battery is not recharged. In other words, this step is implemented without charging the battery between two consecutive running cycles.

This target state of charge $SOC_{target}$ is a non-zero state of charge, which is typically greater than a minimum state of charge required for the vehicle to operate during a running cycle. This target state of charge $SOC_{target}$ can correspond, for example, to a state of charge of 10 to 15% of the maximum state of charge $SOC_{max}$.

Step (c) is implemented until the battery reaches a state of charge that is less than or equal to this target state of charge $SOC_{target}$. To this end, it is possible to monitor the value of the state of charge, for example.

It is possible to proceed as follows, for example. For each running cycle of the discharging step:

the value of the state of charge $SOC_n$ (i) is estimated by measuring the voltage of the battery when running or (ii) by Coulomb counting; then, the value of the state of charge $SOC_n$ is compared with the target state of charge value $SOC_{target}$; and step c) is considered to be completed when $SOC_n$ is less than or equal to $SOC_{target}$.

When estimating the value of the state of charge $SOC_n$ by measuring the voltage of the battery, the measured voltage does not correspond to an open-circuit voltage at the terminals of the battery. It is then possible to determine the open-circuit voltage based on the measured voltage, for example, by Kalman filtering type modeling, then to estimate the state of charge $SOC_n$ based on the open-circuit voltage thus determined.

During this step (c), for each running cycle n (with n being a non-zero integer), the capacity $Q_n$ discharged by the battery is determined, which notably can take into account a charging capacity received by the battery, for example, during braking.

This discharged capacity $Q_n$ is determined, for example, (i) by Coulomb counting the ampere-hours drawn from the battery, or (ii) by Coulomb counting the ampere-hours drawn from and supplied to the battery and by subtracting the ampere-hours supplied to the battery from the ampere-hours drawn from the battery.

This discharged capacity $Q_n$ thus can be written as follows:

[Math 2]

$$Q_n = Ah_{disch-running\ n} - Ah_{ch-running\ n} \quad \text{(Eq 2)}$$

where:

$Ah_{disch-running\ n}$ is the capacity in ampere-hours discharged during the running cycle n and is written as:

[Math 3]

$$Ah_{disch-running\ n} = \int_{start\ running\ n}^{end\ running\ n} I\ dt \quad \text{(Eq 3)}$$

where I is the current flowing from the battery in amperes, and t is the time;

$Ah_{ch-running\ n}$ is the capacity in ampere-hours charged during the running cycle n and is written as:

[Math 4]

$$Ah_{ch-running\ n} = \int_{start\ running\ n}^{end\ running\ n} I\ dt \quad \text{(Eq 4)}$$

where I is the current flowing into the battery in amperes, and t is the time.

Notably, provision can be made to store the value of the estimated state of charge $SOC_n$ and the value of the discharged capacity $Q_n$ for each running cycle.

On completion of step (c), namely at the end of the last running cycle denoted k, a second relaxation step (d) is implemented, during which step the battery is not used over a second duration t_relax_2. This pause time ensures that the open-circuit voltage of the battery returns to a balanced state. The longer this pause time, the closer the measurement of the open-circuit voltage is to reality. The duration of this second relaxation step can be determined beforehand by a person skilled in the art. It is, for example, from 15 minutes to 6 hours, typically from 30 minutes to 1 hour.

Then, during the determination step (e), the state of charge $SOC_{OCV}$ of the battery is determined as a function of the open-circuit voltage, with the battery not being used.

On completion of a discharging step, the estimation of the SOC can be associated with a fairly large error due to the increase in the internal resistance of the battery resulting from its aging. A precise estimate of the SOC could be obtained when the battery is fully discharged (SOC of 0%). This solution would involve carrying out the discharging step until the vehicle cannot run, which is not practical for the driver. The second relaxation step allows the SOC to be precisely estimated without having to reach a minimum state of charge in which the vehicle can no longer run. Indeed, estimating the SOC (denoted $SOC_{OCV}$) based on the measurement of the Open-Circuit Voltage (OCV) is not affected by the increase in the internal resistance of the battery due to its aging.

It is then possible to determine (f) the initial discharge capacity $Q^i$ of the battery in a new state based on the state of charge $SOC_{OCV}$ determined in step (e) and on a previously established correlation for the battery in a new state and correlating the initial discharge capacity with the state of charge of the battery.

This initial discharge capacity $Q^i$ thus corresponds to the capacity that would have been discharged by the battery in the new state during the discharging step (c) between the maximum state of charge and the state of charge $SOC_{OCV}$ determined in step (e).

It is then possible to estimate (g) the state of health SOH of the battery based on the total capacity discharged by the battery during the discharging step (c) and on the initial discharge capacity determined in step (f).

Notably, the state of health SOH of the battery can be estimated by means of the aforementioned equation Eq 1.

The capacity measurements depend on the temperature of the battery. Also, in order to more precisely estimate the SOH, it is preferable for the capacities $Q_n$ and $Q^i$ to be determined when the battery is in the same temperature range. Thus, preferably, when implementing the method according to the invention, when the correlation used during step (f) has been established for a defined temperature range, then, during each running cycle n of the discharging step (c), (i) the battery is maintained at a temperature within this defined temperature range, or (ii) a corrective factor, which is a function of the temperature of the battery, is applied to the capacity $Q_n$ discharged by the battery.

In case (i), the temperature of the battery can be maintained in this temperature range by appropriately controlling a system for cooling/heating the battery. In case (ii), the temperature of the battery can be measured by means of a probe and a model can be used that expresses the corrective factor as a function of the temperature, with this model being pre-established empirically or otherwise.

The estimation method according to the invention is implemented by means of a management system. This management system typically comprises one or more processors (for example, a microprocessor, a microcontroller or the like), notably programmed to implement the method according to the invention. It can also comprise communication means, optionally two-way means, for communicating with the batteries, and means for measuring the voltage and also the temperature of the battery. The one or more processors can comprise storage means, which can be a random access memory (RAM), an electrically erasable programmable read-only memory (EEPROM), a flash memory, an external memory or the like. These storage means can, among other things, store received data, a control model, one or more maps and one or more computer programs. The management system belongs to, for example, or forms part of, the battery management system of the vehicle, also called BMS.

The estimation method according to the invention can be triggered at any time either by the driver of the vehicle containing the battery or by a technician within the context of a maintenance operation. This triggering can occur at any time throughout the lifetime of the vehicle, for example, in the event that the vehicle is resold or of an autonomy problem or for simple information purposes.

It should be noted that if the relaxation steps are not followed, for example, if they are interrupted before the end of the prescribed duration, and/or if the temperature of the battery during the discharging step is not within the defined temperature range, provision can be made to interrupt the estimation method, or to continue it in degraded mode. The state of health thus estimated is actually less precise than if it had been determined subject to the conditions of the prescribed duration of the relaxation steps and/or of the temperature of the battery during the discharging step.

When the evaluation method is ongoing, provision can be made to:

(i) store, at the end of every running cycle n, the capacity $Q_n$ discharged during the running cycle n and the state of charge $SOC_n$ for the running cycle n;

(ii) compare, the next time the management system is powered-on, in other words, the next time the vehicle is started, the state of charge $SOC_n$ determined during the last running cycle n with the target state of charge $SOC_{target}$, and:

a. if this state of charge $SOC_n$ is less than or equal to the target state of charge $SOC_{target}$, and if the battery has not been used during the duration prescribed by the second relaxation step, then steps (e) to (g) are implemented;

b. if this state of charge is greater than the target state of charge, the number of running cycles is incremented by 1 (equal to n+1) and step (e) continues, namely the discharged capacity is determined for this running cycle $SOC_{n+1}$, then the method returns to step (i) for this cycle (n+1).

Moreover, the management system can be configured (programmed) to carry out tests each time it is powered-on in order to check the state of the estimation method according to the invention. It can carry out the following tests, for example:

Test T1: is the battery fully charged (maximum state of charge reached)?

(i) If the response is yes, then a reset of the stored variables can be provided such that:

the discharge capacity $Q_n$, the value $SOC_n$, and the index n for counting the number of discharging running cycles is reset to zero;

the time quantities used to record the absolute starting times of each of the running phases and the initial SOC quantities at the beginning of each running cycle are reset to zero, these quantities allow the influence of the number of running cycles to be checked in order to transition from the maximum state of charge (100%) to a state of charge lower than $SOC_{target}$. The system is then ready to start the estimation method according to the invention.

(ii) If the response is no, the system transitions to test T2.

Test T2: if the vehicle starts to run and $SOC>SOC_{target}$ and the determination method according to the invention is ongoing, then the index n is incremented by 1, $Q_n$ and the state of charge $SOC_n$ are determined. If not, the system transitions to test T3.

Test T3: if the battery is in a relaxed state and $SOC<SOC_{target}$ (which corresponds to the completion of step (d) of the method according to the invention), then the state of charge $SOC_{OCV}$ of the battery (step (e) of the method), the initial discharge capacity $Q^i$ (step (f) of the method) and the state of health SOH (step (g)) are determined. If this is not the case, the system transitions to test T4.

Test T4: is the battery charging? If yes, the estimation method according to the invention is interrupted.

The invention claimed is:

1. A method for estimating the state of health of a battery of an electric or hybrid vehicle, comprising:

(a) a step of charging the battery until the battery reaches a maximum state of charge $SOC_{max}$;

(b) a first relaxation step, during which the battery is not used for a first duration;

(c) a step of discharging the battery until the battery reaches a state of charge that is less than or equal to a non-zero target state of charge $SOC_{target}$, with the discharging step being carried out in a number k of running cycles of the vehicle, with k being a non-zero integer, and, for each running cycle n where $1 \leq n \leq k$, the capacity $Q_n$ discharged by the battery is determined;

(d) a second relaxation step, at the end of the running cycle k, during which step the battery is not used for a second duration;

(e) a step of determining a state of charge $SOC_{OCV}$ of the battery as a function of the open-circuit voltage, with the battery not being used;

(f) a step of determining an initial discharge capacity $Q^i$ of the battery in a new state based on the state of charge determined in step (e) and on a previously established correlation for the battery in a new state and correlating the initial discharge capacity with the state of charge of the battery; and (g) a step of estimating the state of health SOH of the battery based on the total capacity discharged by the battery during the discharging step (c) and on the initial discharge capacity determined in step (f).

2. The estimation method as claimed in claim 1, wherein, during the estimating step (g), the state of health SOH of the battery is estimated using the following equation:

[Math 1]

$$SOH = \frac{\sum_{n=1}^{k} Q_n}{Q^i} \times 100$$

where $Q_n$ represents the capacity discharged by the battery during a running cycle n, with n being a non-zero integer ranging from 1 to k, and $Q^i$ represents the initial discharge capacity.

3. The estimation method as claimed in claim 1, further comprising, between the first relaxation step (b) and the discharging step (c), a checking step involving checking that the state of charge of the battery in the relaxed state has reached the maximum state of charge.

4. The estimation method as claimed in claim 1, wherein, during the discharging step (c), for each running cycle, the capacity discharged by the battery takes into account a charging capacity received by the battery.

5. The estimation method as claimed in claim 1, wherein, during the discharging step (c), the capacity discharged by the battery (i) is determined by Coulomb counting the ampere-hours drawn from the battery, or (ii) by Coulomb counting the ampere-hours drawn from and supplied to the battery and by subtracting the ampere-hours supplied to the battery from the ampere-hours drawn from the battery.

6. The estimation method as claimed in claim 1, wherein, for each running cycle n of the discharging step (c), a value of the state of charge SOC, of the battery (i) is estimated by measuring the voltage of the battery when running or (ii) by Coulomb counting, then the value of the state of charge SOC, is compared with the target state of charge value $SOC_{target}$ and step (c) is considered to be complete when SOC, is less than or equal to $SOC_{target}$.

7. The estimation method as claimed in claim 1, wherein the correlation used during step (f) has been set for a defined temperature range, and, during each running cycle of the discharging step (c), (i) the battery is maintained at a temperature within the defined temperature range, or (ii) a corrective factor is applied to the capacity $Q_n$ discharged by the battery as a function of the temperature of the battery.

8. A non-transitory computer readable medium storing a program that, when executed by a computer, causes the computer to execute the estimation method as claimed in claim 1.

9. A battery management system configured to estimate the state of charge of a battery by implementing the steps of the estimation method as claimed in claim 1.

10. A motor vehicle equipped with a traction battery comprising the battery management system as claimed in claim 9.

* * * * *